United States Patent
Quek et al.

(10) Patent No.: US 6,737,739 B2
(45) Date of Patent: May 18, 2004

(54) METHOD OF VACUUM PACKAGING A SEMICONDUCTOR DEVICE ASSEMBLY

(75) Inventors: Shyue-Fong Quek, Petaling Jaya (MY); Ting Cheong Ang, Singapore (SG); Duay Ing Ong, Kluang Johor (MY); Sang Yee Loong, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 10/283,922

(22) Filed: Oct. 30, 2002

(65) Prior Publication Data

US 2003/0052403 A1 Mar. 20, 2003

Related U.S. Application Data

(62) Division of application No. 09/431,238, filed on Nov. 1, 1999, now Pat. No. 6,495,399.

(51) Int. Cl.[7] .......................... H01L 23/52; H01L 23/12
(52) U.S. Cl. .................. 257/691; 257/700; 257/707; 257/693
(58) Field of Search ................. 257/691, 692, 257/693, 680, 681, 700, 707, 690, 755, 632; 438/125

(56) References Cited

U.S. PATENT DOCUMENTS

| | | | |
|---|---|---|---|
| 5,049,972 A | * 9/1991 | Uda et al. | |
| 5,203,076 A | * 4/1993 | Banerji et al. | |
| 5,281,151 A | * 1/1994 | Arima et al. | |
| 5,296,743 A | * 3/1994 | Nguyen et al. | |
| 5,401,687 A | 3/1995 | Cole et al. | 437/182 |
| 5,708,303 A | * 1/1998 | Jeng | |
| 5,766,987 A | 6/1998 | Mitchell et al. | 438/126 |
| 5,798,557 A | 8/1998 | Salatino et al. | 257/416 |
| 5,866,442 A | 2/1999 | Brand | 438/108 |
| 5,915,168 A | 6/1999 | Salatino et al. | 438/110 |
| 6,011,694 A | * 1/2000 | Hirakawa | |

* cited by examiner

Primary Examiner—Long Pham
Assistant Examiner—Dilinh Nguyen
(74) Attorney, Agent, or Firm—George O. Saile; Rosemary L. S. Pike; Stephen G. Stanton

(57) ABSTRACT

A semiconductor chip device package comprised of a semiconductor substrate having semiconductor devices formed on the semiconductor substrate. At least one dielectric layer is over the semiconductor substrate. At least one layer of interconnects is over the semiconductor devices and within the at least one respective dielectric layer with at least a portion of the interconnects being separated by voids having a vacuum or air therein. A passivation layer is over the uppermost of the at least one layer of interconnects. Wherein the semiconductor chip device is vacuum sealed within a semiconductor chip device package.

16 Claims, 2 Drawing Sheets

METHOD OF VACUUM PACKAGING A SEMICONDUCTOR DEVICE ASSEMBLY

This is a division of patent application Ser. No. 09/431,238, filing date Nov. 1, 1999, now U.S. Pat. No. 6,495,399, Method Of Vacuum Packaging A Semiconductor Device Assembly, assigned to the same assignee as the present invention.

FIELD OF THE INVENTION

The present invention relates generally to methods of electronic packaging technology, and specifically to a vacuum type of electronic packaging technology used with air gap interconnect semiconductor chips.

BACKGROUND OF THE INVENTION

Modern integrated circuit semiconductor devices are complex three-dimensional structures with metallized conductor lines, such as interconnects, separated or insulated by interlayer dielectrics. Inorganic materials, such as silicon dioxides ($SiO_2$) and silicon nitride ($Si_3N_4$), are conventionally used as these interlayer dielectrics.

Recently, the photo-definable derivatives of certain polymeric materials, such as polyimides, silicone-polyimides, and benzocyclobutenes, have become widely used as interlayer dielectrics because they tend to have lower dielectric constants (k) compared to inorganic interlayer dielectrics. A lower-k interlayer dielectric reduces the signal propagation delays and enhances the system performance. For example silicon dioxide has a dielectric constant of about 4, while Teflon® is a material that has one of the lower dielectric constants, i.e. about 2.0 (Air has a dielectric constant of 1). However Teflon® has certain characteristics and process issues that must be addressed before it can be widely used.

The major functions of electronic packaging are to: a) support and protect the chip from hostile environments; b) distribute the signals onto and off of the silicon chip; c) provide a path for the electrical current that powers the circuits on the chip; and d) remove the heat generated by the circuits.

Back end-of-line (BEOL) resistance capacitance (RC) is becoming increasingly important in ultra large-scale integration (ULSI) where an integrated circuit (IC) contains over 10 million semiconductor devices, and thus where the design rule approaches 0.25 µm and smaller.

U.S. Pat. No. 5,866,442 to Brand et al. describes a semiconductor device assembly with a semiconductor device spaced apart from a substrate to define a gap to be filled by a fill material. The substrate has thermal vias formed therein and after the semiconductor device is connected to the substrate and the fill material is positioned about the gap to form a seal, a vacuum is drawn through the thermal vias and a pressure is applied to the fill material to urge the fill material into the interior of the gap.

U.S. Pat. No. 5,766,987 to Mitchell et al. describes methods and equipment whereby microelectronic assemblies such as semiconductor chip assemblies are encapsulated. Covering layers not only protect both the terminals carried by a dielectric layer and the bottom surface of the semiconductor chips in each assembly, but also confine a liquid encapsulant and prevents contamination of the terminals and the chip bottom surfaces. The liquid encapsulant and the assemblies are placed into a tilting fixture, the fixture is closed and evacuated, and the encapsulant is them poured onto the assemblies while maintaining the fixture under vacuum. The fixture is then pressurized during cure of the encapsulant.

U.S. Pat. No. 5,401,687 to Cole et al. describes a method for preserving an air bridge structure on an integrated circuit chip used in an overlay process. A patternable protective layer is applied for mechanical strength to prevent deformation during subsequent processing. A polymeric film layer is applied over the chip and protective layer and interconnections are fabricated through the polymeric film layer. The polymeric film layer is removed from the area over the air bridge structure and the protective layer is then removed leaving the resultant structure with an undamaged air bridge free of residue.

U.S. Pat. No. 5,798,557 to Salatino et al. and U.S. Pat. No. 5,915,168 to Salatino et al. (a divisional of the Salatino U.S. Pat. No. 5,798,557), describe a packaged integrated circuit (IC) and method of making same, respectively, where the IC is a wafer level hermetically packaged IC that has a protective cover wafer bonded to a semiconductor device substrate wafer. The substrate wafer may contain a cavity. The cover wafer seals integrated circuits and other devices such as air bridge structures, resonant beams, surface acoustic wave (SAW) devices, trimmable resistors and micromachines. Some devices are formed on the surface of cavities formed in the protective cover wafer. Dies are separated to complete the process.

SUMMARY OF THE INVENTION

Accordingly, it is an object of the present invention to provide a semiconductor chip device package having a vacuum within interconnect voids in the semiconductor chip device to reduce the interconnective RC delay and prevent metal corrosion.

Another object of the present invention is to provide a low cost packaging technology which changes the dielectric k-value to reduce the interconnective RC delay and prevent metal corrosion.

Yet another object of the present invention is to provide a method of forming a packaged semiconductor assembly by drawing a vacuum on an entire air gap semiconductor device to form a vacuum within the voids separating the interconnects.

A further object of the present invention is to provide a semiconductor chip device package having a vacuum within interconnect voids in the semiconductor chip device to lower the interlevel dielectric constant to reduce the signal propagation delays and enhance the system performance.

Other objects will appear hereinafter.

It has now been discovered that the above and other objects of the present invention may be accomplished in the following manner. Specifically, a semiconductor chip device package is comprised of a semiconductor substrate having semiconductor devices formed on the semiconductor substrate. At least One dielectric layer is over the semiconductor substrate. At least one layer of interconnects is over the semiconductor devices and within the at least one respective dielectric layer with at least a portion of the interconnects being separated by voids having a vacuum or air therein. A passivation layer is over the uppermost of the at least one layer of interconnects. Wherein the semiconductor chip device is vacuum sealed within a semiconductor chip device package.

BRIEF DESCRIPTION OF THE DRAWINGS

The features and advantages of the method of forming a packaged semiconductor assembly according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
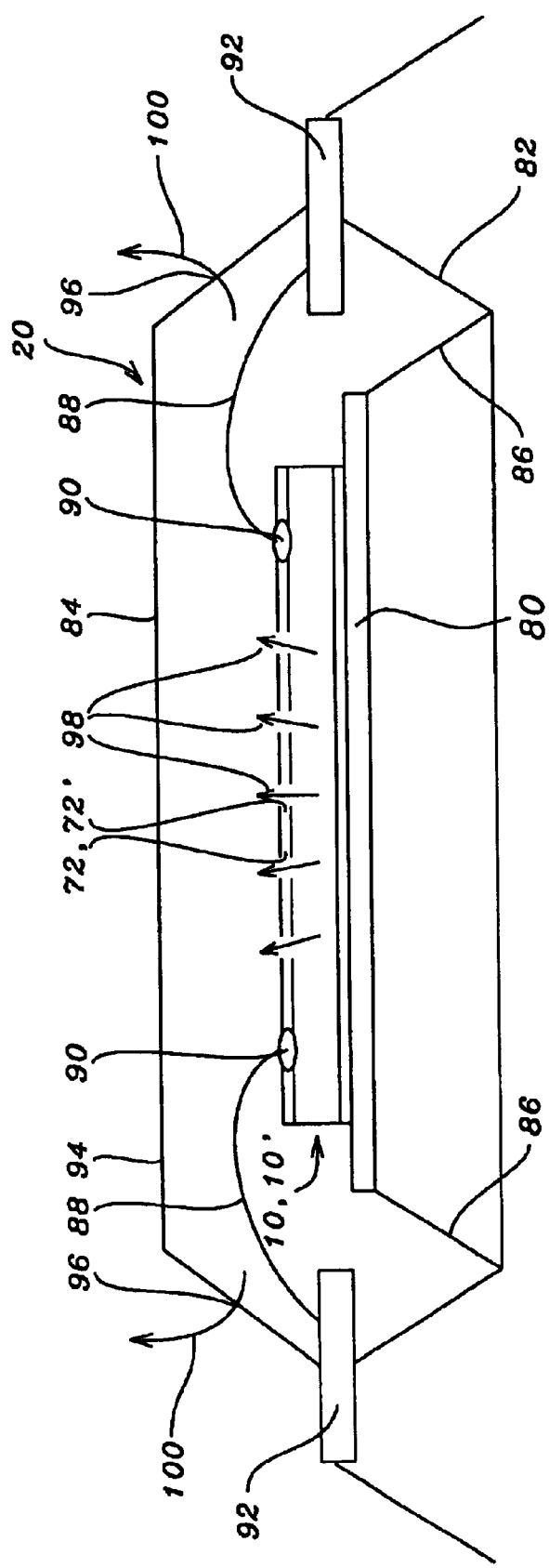
FIG. 1 schematically illustrates in cross-sectional representation a preferred embodiment of the present invention.

Accordingly as shown in FIG. 1, semiconductor chip device 10, 10' is shown within, for example, a first level, electronic package 20 made in accordance with an embodiment of the present invention. Electronic package 20 may be one of several types of electronic packages as will be noted hereafter. Unless otherwise specified, all structures, layers, etc. may be formed or accomplished by conventional methods known in the prior art.

Figure 2:
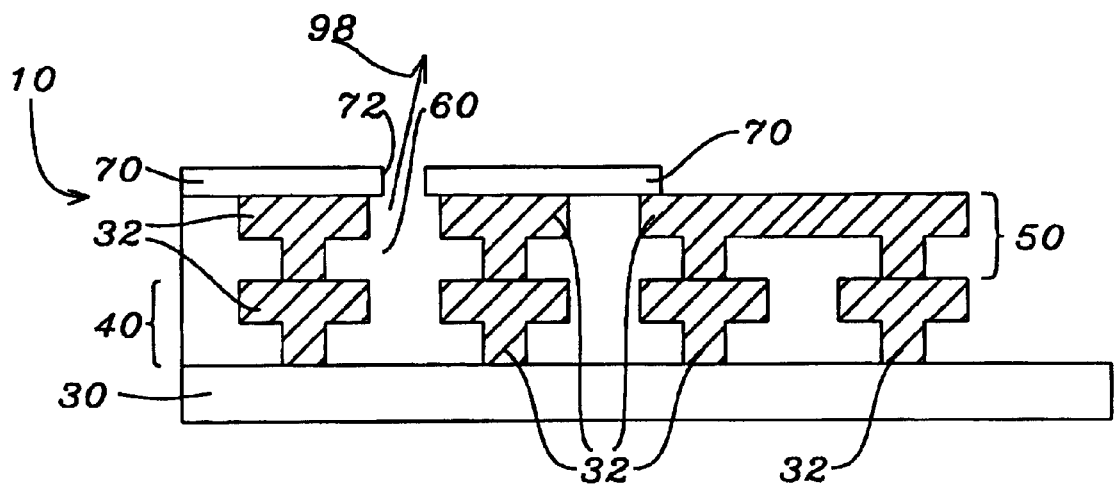
FIG. 2 schematically illustrates in cross-sectional representation a sample air gap structure of a semiconductor device, having dual damascene interconnects, used with the method of the present invention.

FIG. 2 illustrates a semiconductor chip device 10 of the present invention having dual damascene interconnects 32.

Figure 3:
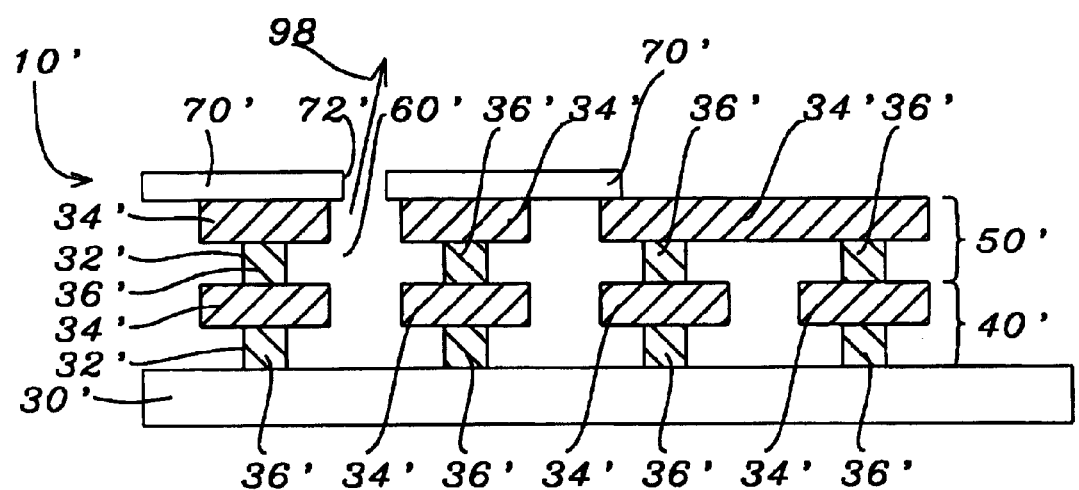
FIG. 3 schematically illustrates in cross-sectional representation a sample air gap structure of a semiconductor device, having interconnects with an upper metal line and a lower metal plug, used with the method of the present invention.

FIG. 3 illustrates a semiconductor chip device 10' of the present invention having interconnects 32' with an upper metal line 34' and a lower metal plug 36'.

Either semiconductor chip device 10, 10' structure may be used in the present invention as well as any other semiconductor chip device utilizing air gap technology.

As shown in FIGS. 2 and 3, regardless of which semiconductor chip device 10, 10' of FIGS. 2 and 3, respectively, is selected, the following description is essentially common to each semiconductor chip device 10, 10' so used.

Each semiconductor chip device 10, 10' has starting semiconductor structure 30, 30' which is understood to possibly include a semiconductor wafer or substrate with exposed active and passive devices on the upper surface of the wafer. The term "semiconductor structure" is meant to include devices formed within a semiconductor wafer and the layers overlying the wafer.

A first dielectric layer (not shown) is formed over semiconductor structure 30, 30'. Either a first dual damascene interconnect 32 layer 40 of FIG. 2, or a first interconnect 32' layer 40' comprising a horizontal metal line 34' over a vertical metal plug 36' of FIG. 3, is formed within the first dielectric layer by photoresist masking/patterning and etching steps as is known in the prior art. Interconnects 32, 32' contact the exposed active and/or passive devices on the upper surface of the wafer.

As desired a second dielectric layer (not shown) is formed over first interconnect layer 40, 40' and the first dielectric layer. Again, another layer of interconnects 32 or 32' is formed, this time over the first level of interconnects.

A second dual damascene interconnect layer 50 is formed over first dual damascene interconnect layer 40 in forming the semiconductor chip device 10 of FIG. 2. A second interconnect layer 50' comprising a horizontal metal line 34' over a vertical metal plug 36' is formed over first interconnect layer 40' in forming the semiconductor chip device 10' of FIG. 3. Of course it is possible to combine dual damascene interconnects with interconnects having a horizontal metal line over a vertical metal plug, or visa versa.

Additional layers of dielectric layers and interconnect layers may be formed as desired. Only two levels of interconnects 40, 50; 40', 50' are illustrated herein. Dielectric layers may be comprised of low-k materials such as silicon oxide ($SiO_2$), for example, and interconnect layers 40, 40'; 50, 50' may be comprised of tungsten (W), for example. Other materials may be used as is known in the prior art.

After the final dielectric and interconnect layer is formed, at least a portion of the dielectric material separating interconnect layers 40, 40'; 50, 50' (for example in a two interconnect layer semiconductor chip device as illustrated in FIGS. 2 and 3) is etched to form air filled voids 60, 60' between interconnect layers 40, 40'; 50, 50' at least in some portions of the semiconductor chip device 10, 10'.

Passivation layer 70, 70' is then formed over the structure and may comprise silicon nitride ($Si_3N_4$), for example. Passivation layer 70, 70' further has openings 72, 72' therein communicating with at least some of voids 60, 60'. Voids 60, 60' contain the ambient atmosphere such as air. This completes formation of semiconductor chip device 10, 10'.

Semiconductor chip device 10, 10' is then packaged within, for example, a first level electronic package (vacuum type packaging) 20. Any type of packaging currently used in the industry may be used as long as the packaging can maintain the vacuum. For example, the following vacuum type packaging may be used ceramic, rubber seal, hermetic seal and metal cap.

As shown in FIG. 1, semiconductor chip device 10, 10' is affixed to a support structure, such as chip pad or lead frame 80. Chip pad 80 may be attached to lower portion 82 of outer package structure 84, for example, by legs 86 or other such structure.

Semiconductor chip device 10, 10' may be electrically connected to other devices external to outer package structure 84 by affixing wire bonds 88, to the bonding pads (not shown) of semiconductor chip device 10, 10' (not shown) by solder balls 90. The other end of wire bonds 88 are affixed to lead frames 92 which extend from electronic package 20.

Upper portion 94 of outer package structure 84 is affixed to lower portion 82 of outer package structure 84. Upper portion 94 of outer package structure 84 may be formed from thermoplastic polymers, thermosetting polymers or elastomers, such as, for example, plastic, mold resin, silicones, epoxies, polyurethanes, polyimides, silicone-polyimides, parylenes, Teflon®, ceramic metal, and composite polymers. Outer package 84 may be any of the materials used currently in the market as long as it can keep the vacuum.

Outer package structure 84 has one or more openings at 96, for example, and a source or vacuum is applied through openings 96. For example, outer package structure 84 may be placed within a chamber (not shown) upon which a vacuum may be drawn by a pump, for example (not shown).

As a vacuum is formed within outer package structure 84, the air, or ambient atmosphere, is preferably drawn from voids 60, 60' through openings 72, 72' in passivation layer 70, 70' as shown at 98 (Also see FIGS. 2 and 3). The air, or ambient atmosphere is further drawn from outer package structure 84 through outer package structure openings 96 as shown at 100 to create a vacuum within voids 60, 60' and within outer package structure 84 from about $10^{-6}$ Torr to $10^{-10}$ Torr, and more preferably from about $10^{-7}$ Torr to $10^{-8}$ Torr.

Openings 72, 72' may be sealed allowing air filled voids 60, 60' to remain within semiconductor chip device 10, 10' although passivation layer 70, 70' preferably has openings 72, 72', respectively, permitting formation of a vacuum within voids 60, 60' when the vacuum is formed within outer package structure 84 as described above.

Outer package structure openings 96 are sealed while maintaining the vacuum within voids 60, 60' and within sealed outer package structure 84. This completes the formation of electronic package 20 of the present invention. Electronic package 20 may be hermetically sealed.

For semiconductor chip device packages 20 that are low-pin-count integrated circuit devices having a pin count less than about 300, the semiconductor chip device package may be a plastic quad flat pack (PQFP), Swiss outline package (SOP), Swiss outline J-leaded (SOJ), small outline integrated circuit (SOIC), plastic leaded chip carrier (PLCC), thin quad flat pack (TQFP), thin small outline package (TSOP), direct chip attach on printed circuit board (DCA), or a chip scale package (CSP), for example.

For semiconductor chip device packages 20 that are mid-pin-count integrated circuit devices having a pin count from about 250 to 600 such as main memory and cache memory, the semiconductor chip device package may be a tape carrier package (TCP), plastic pin grid array (PPGA), ceramic pin grid array (CPGA), or a plastic ball grid array (PBGA), for example.

For higher pin count semiconductor chip device packages 20 having a pin count greater than about 500, such as application specific integrated circuits (ASIC), the semiconductor chip device package may be a ceramic ball grid array (CBGA), tape ball grid array (TBGA), or metal ball grid array (MBGA), for example.

For very high pin count semiconductor chip device packages 20 having a pin count of at least about 1000, such as performance integrated circuit devices, the semiconductor chip device package may be an area-array solder-bumped flip-chip technology package.

Whatever package type is used, there are several advantages to having a vacuum within voids 60, 60' (and within outer package structure 84).

One such advantage is that since a vacuum is formed with voids 60, 60' there is less likelihood of contamination of the underlying semiconductor devices in semiconductor structure 30, 30' connected to interconnects 32, 32'. This is because there is not any dielectric material separating interconnects 32, 32' which may have contaminants, and there is minimal air, or ambient atmosphere within voids 60, 60' which may also have contaminants Another advantage is that the vacuum within voids 60, 60' and within outer package structure 84 provides for a more efficient and greater dissipation of heat from the semiconductor chip device and from outer package structure 84

Yet another advantage is that the vacuum within voids 60, 60' reduces the interlayer dielectric constant (k) to 1, reducing the signal propagation delays and enhancing the system performance.

While particular embodiments of the present invention have been illustrated and described, it is not intended to limit the invention, except as defined by the following claims.

We claim:

1. A semiconductor chip device package comprised of:
   a semiconductor substrate;
   semiconductor devices formed on said semiconductor substrate;
   at least one dielectric layer over said semiconductor substrate;
   at least one layer of interconnects over said semiconductor devices and within said at least one respective dielectric layer; at least a portion of said interconnects being separated by voids; said voids having a vacuum or air therein; and
   a passivation layer over the uppermost of said at least one layer of interconnects;
   wherein said semiconductor chip device is vacuum sealed within a semiconductor chip device package.

2. The device of claim 1, wherein said semiconductor chip device package is a low-pin-count integrated circuit device having a pin count less than about 200, and said package is selected from the group comprising: plastic quad flat pack (PQFP); Swiss outline package (SOP); Swiss outline J-leaded (SOJ); small outline integrated circuit (SOIC); plastic leaded chip carrier (PLCC); thin quad flat pack (TQFP); thin small outline package (TSOP); direct chip attach on printed circuit board (DCA); and chip scale package (CSP).

3. The device of claim 1, wherein said semiconductor chip device package is a mid-pin-count integrated circuit device having a pin count from about 250 to 600 such as main memory and cache memory, and said package is selected from the group comprising: tape carrier package (TCP); plastic pin grid array (PPGA); ceramic pin grid array (CPGA); and plastic ball grid array (PBGA).

4. The device of claim 1, wherein said semiconductor chip device package is a higher-pin-count integrated circuit device having a pin count greater than about 500 such as application specific integrated circuits (ASIC), and said package is selected from the group comprising: ceramic ball grid array (CBGA); tape ball grid array (TBGA); and metal ball grid array (MBGA).

5. The device of claim 1, wherein said semiconductor chip device package is a very-high-pin-count integrated circuit device having a pin count of at least about 1000 such as performance integrated circuit devices, and said package is an area-array solder-bumped flip-chip technology package.

6. The device of claim 1, wherein said passivation layer has openings therein exposing said voids.

7. The device of claim 1, wherein said interconnects are dual damascene interconnects.

8. The device of claim 1, wherein said voids having a vacuum.

9. A semiconductor chip device package comprised of:
   a semiconductor substrate;
   semiconductor devices formed on said semiconductor substrate;
   at least one dielectric layer over said semiconductor substrate;
   at least one layer of interconnects over said semiconductor devices and within said at least one respective dielectric layer; at least a portion of said interconnects being separated by voids; said voids having a vacuum or air therein; and
   a passivation layer over the uppermost of said at least one layer of interconnects;
   wherein said semiconductor chip device is vacuum sealed within a package and is electrically connected to lead frames extending from said package to form a semiconductor chip device package.

10. The device of claim 9, wherein said semiconductor chip device package is a low-pin-count integrated circuit device having a pin count less than about 200, and said package is selected from the group comprising: plastic quad flat pack (PQFP); Swiss outline package (SOP); Swiss outline J-leaded (SOJ); small outline integrated circuit (SOIC); plastic leaded chip carrier (PLCC); thin quad flat pack (TQFP); thin small outline package (TSOP); direct chip attach on printed circuit board (DCA); and chip scale package (CSP).

11. The device of claim 9, wherein said semiconductor chip device package is a mid-pin-count integrated circuit device having a pin count from about 250 to 600 such as main memory and cache memory, and said package is selected from the group comprising: tape carrier package (TCP); plastic pin grid array (PPGA); ceramic pin grid array (CPGA); and plastic ball grid array (PBGA).

12. The device of claim 9, wherein said semiconductor chip device package is a higher-pin-count integrated circuit device having a pin count greater than about 500 such as application specific integrated circuits (ASIC), and said package is selected from the group comprising: ceramic ball grid array (CBGA); tape ball grid array (TBGA); and metal ball grid array (MBGA).

13. The device of claim 9, wherein said semiconductor chip device package is a very-high-pin-count integrated circuit device having a pin count of at least about 1000 such as performance integrated circuit devices, and said package is an area-array solder-bumped flip-chip technology package.

14. The device of claim 9, wherein said passivation layer has openings therein exposing said voids.

15. The device of claim 9, wherein said interconnects are dual damascene interconnects.

16. The device of claim 9, wherein said voids having a vacuum.

* * * * *